(12) United States Patent
Li et al.

(10) Patent No.: US 7,015,757 B2
(45) Date of Patent: Mar. 21, 2006

(54) TRANSCONDUCTANCE AMPLIFIER WITH MULTI-EMITTER STRUCTURE FOR CURRENT BALANCE IN A MULTI-PHASE REGULATOR

(75) Inventors: Xuening Li, Cary, NC (US); Thomas A. Jochum, Durham, NC (US)

(73) Assignee: Intersil Americas Inc., Milpitas, CA (US)

( * ) Notice: Subject to any disclaimer, the term of this patent is extended or adjusted under 35 U.S.C. 154(b) by 32 days.

(21) Appl. No.: 10/803,006

(22) Filed: Mar. 17, 2004

(65) Prior Publication Data
US 2005/0128005 A1    Jun. 16, 2005

Related U.S. Application Data

(60) Provisional application No. 60/530,047, filed on Dec. 16, 2003.

(51) Int. Cl.
*H03F 3/45* (2006.01)
*G05F 3/16* (2006.01)

(52) U.S. Cl. .................... 330/257; 330/260; 330/297; 323/315

(58) Field of Classification Search .................. None
See application file for complete search history.

(56) References Cited

U.S. PATENT DOCUMENTS
6,181,203 B1 *  1/2001  Newlin ..................... 330/257

OTHER PUBLICATIONS

Microsemi Intergrated Products, Preliminary Data Sheet LX1677 AMD64 Processor VRM Controller, Copyright 2000 Revised Mar. 3, 2003, pp. 1-16, Microsemi Garden Grove, California, U.S.A.

* cited by examiner

*Primary Examiner*—Khanh V. Nguyen
(74) *Attorney, Agent, or Firm*—Gary R. Stanford

(57) ABSTRACT

A transconductance amplifier with multi-emitter structure for balancing current of a multi-phase regulator including multiple transistors, a bias current device, multiple current mirrors, and multiple current sources. Each transistor has first and second current terminals and a current control terminal receiving a corresponding one of multiple sense voltages. Each sense voltage is indicative of output inductor current of a corresponding phase of the multi-phase regulator. The bias current device is coupled to the first current terminal of each transistor. Each current mirror has an input coupled to a second current terminal of a corresponding transistor and an output coupled to a corresponding one of multiple correction nodes. Each current source is coupled to a corresponding one of multiple correction nodes. In this manner, each correction node provides a correction current for a corresponding phase of the regulator.

18 Claims, 2 Drawing Sheets

Figure 1:
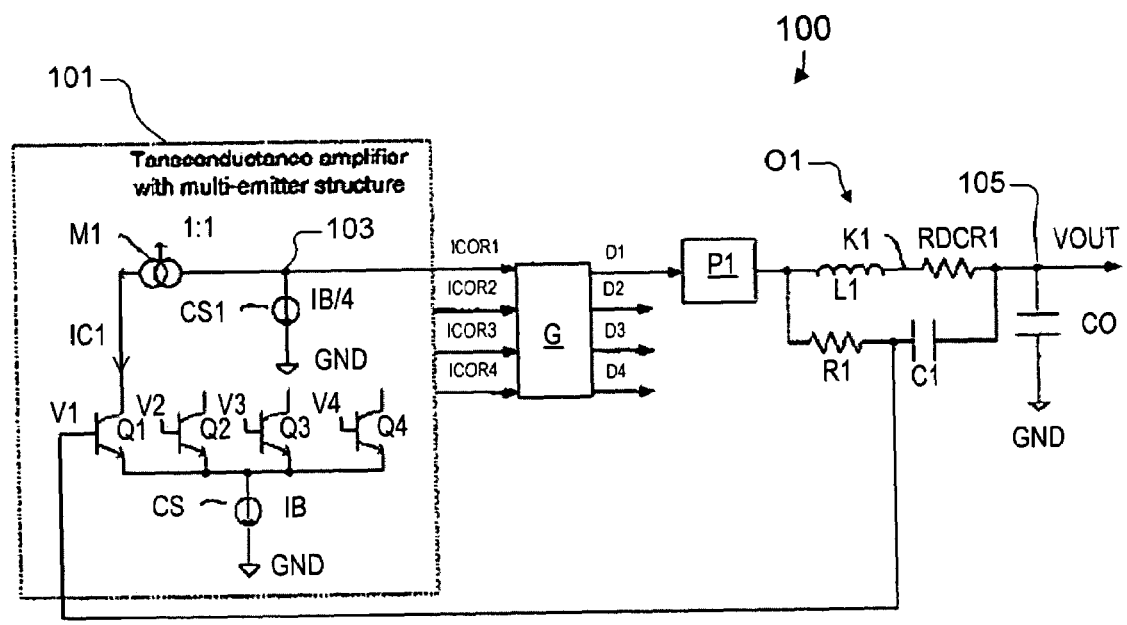

TRANSCONDUCTANCE AMPLIFIER WITH MULTI-EMITTER STRUCTURE FOR CURRENT BALANCE IN A MULTI-PHASE REGULATOR

CROSS-REFERENCE TO RELATED APPLICATIONS

This application claims the benefit of U.S. Provisional Application No. 60/530,047 filed on Dec. 16, 2003, entitled "TRANSCONDUCTANCE AMPLIFIER WITH MULTI-EMITTER STRUCTURE FOR CURRENT BALANCE IN MULTI-PHASE SYNTHETIC RIPPLE REGULATOR", which is herein incorporated by reference for all intents and purposes.

BACKGROUND OF THE INVENTION

1. Field of the Invention

The present invention relates to PWM power regulators and multi-phase DC—DC converters, and more particularly to a transconductance amplifier with multi-emitter structure for current balance in multi-phase regulator.

2. Description of the Related Art

In steady state operation of multi-phase regulators, including synthetic ripple regulators, the pulse-width modulation (PWM) control signal for each phase is predetermined by input and output voltage and load level. The differences between the phases cause current imbalance, which is undesirable and results in loss of efficiency.

SUMMARY OF THE INVENTION

A transconductance amplifier with multi-emitter structure for balancing current of a multi-phase regulator according to an embodiment of the present invention includes multiple transistors, a bias current device, multiple current mirrors, and multiple current sources. Each transistor has first and second current terminals, and a current control terminal receiving a corresponding one of multiple sense voltages. Each sense voltage is indicative of output inductor current of a corresponding phase of the multi-phase regulator. The bias current device is coupled to the first current terminal of each transistor. Each current mirror has an input coupled to a second current terminal of a corresponding transistor and an output coupled to a corresponding one of multiple correction nodes. Each current source is coupled to a corresponding one of multiple correction nodes. In this manner, each correction node provides a correction current for a corresponding phase of the regulator.

In one embodiment for N transistors and in which the bias current device develops a current IB, each current source develops a current IB/N. Thus, the total transistor current is IB where each develops a relative current based on a corresponding one of the sense voltages. The relative currents are mirrored into the correction nodes. Each correction node provides a correction current being the difference between the relative transistor current and the current IB/N. In a more specific embodiment, the transistors are bipolar transistors in which the sense voltages are applied to the bases and the bias current device is coupled to common-coupled emitters.

Each sense voltage is indicative of output inductor current, such as representing the voltage of a DCR of a corresponding output inductor. The transconductance amplifier may be implemented with input buffer stages, such as amplifier filter stages for amplifying and filtering the sense voltages.

An N-phase regulator according to an embodiment of the present invention includes N output circuits for each of N phases, N output current sensing circuits, a transconductance amplifier with multi-emitter structure, and a power circuit. Each output current sensing circuit senses output current of a corresponding one of the N output circuits and provides a corresponding one of N sense voltages. The transconductance amplifier includes N transistors, a bias current device, N current mirrors and N current sources. Each transistor has first and second current terminals and a control terminal receiving a corresponding one of the N sense voltages. The bias current device is coupled to the first current terminal of each of the N transistors. Each current mirror has an input coupled to a second terminal of a corresponding transistor and an output coupled to a corresponding one of N correction nodes. Each current source is coupled to a corresponding correction node. The power circuit has N inputs each coupled to a corresponding one of the N correction nodes and N outputs each providing a PWM signal with corrected duty cycle to a corresponding output circuit.

In various embodiments of the regulator, the bias current device develops a current IB, where the current sources sink a current IB/N from each correction node. Each of the sense voltages may be based on a corresponding DCR voltage of an output inductor. The power circuit may be an N-channel modulator block that adjusts duty cycle of each of N PWM signals based on a corresponding one of the N correction currents.

A method of balancing current in an N-phase regulator according to an embodiment of the present invention includes sensing output current for each of the N phases and providing corresponding N feedback sense voltages, biasing N transistors with a total bias current of IB, applying each of the N feedback sense voltages to a control input of a corresponding one of the N transistors to develop N sense currents, mirroring each of the N sense currents into a corresponding one of N correction nodes, sourcing a current of IB/N relative to each of the N correction nodes to provide N correction currents, and adjusting current of each of the N phases based on a corresponding correction current.

The method may include sensing voltage across the DCR of an output inductor. The method may include sourcing a current IB relative to common-coupled emitters of the N transistors. The method may include drawing a current of IB/N from each of the N correction nodes. The method may include adjusting duty cycle of each of N PWM control signals.

BRIEF DESCRIPTION OF THE DRAWING(S)

Figure 2:
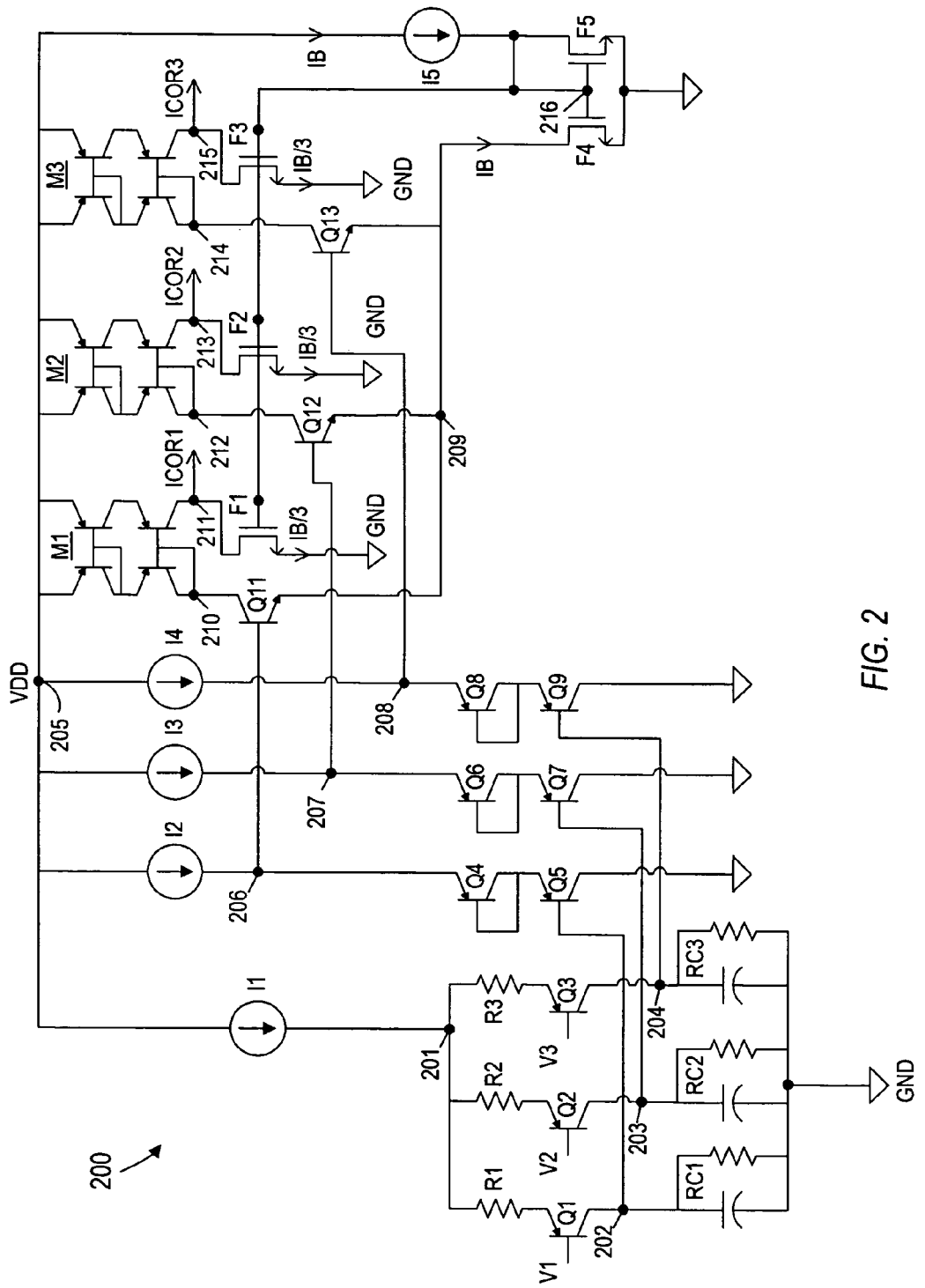

The benefits, features, and advantages of the present invention will become better understood with regard to the following description, and accompanying drawing in which:

FIG. 1 is a simplified schematic and block diagram of a multi-phase synthetic ripple regulator including a transconductance amplifier with multi-emitter structure implemented according to an exemplary embodiment of the present invention to achieve current balance for four phases; and FIG. 2 is a more detailed schematic diagram of a transconductance amplifier with multi-emitter structure implemented according to an exemplary embodiment of the present invention to achieve current balance for three phases.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

In a multiphase regulator in steady state, including synthetic ripple regulators, the PWM for each phase is predetermined by input and output voltage and load level. Any differences between the phases causes current imbalance. The present disclosure concerns a system and method for achieving current balance in a multiphase regulator. The relative voltages of the DC resistance (DCR) of each output inductor (or current sensing resistors) are sensed and fed back to a multi-emitter structure. The feedback loop is used to adjust the inductor current on each phase. The loop may have relatively high gain. Compensation is achieved by an external resistor-capacitor (RC) circuit and provides for precise current balance and stable loop. The current balance information is collected from the inductor DCR voltages or current sensing resistors. The multi-emitter structure outputs the correction currents for each phase based on the differential input voltages of the phases. The output currents are used to adjust the PWM duty cycles for current balance. In one embodiment, the number of pins for current balance sensing is equal to the number of phases.

FIG. 1 is a schematic and block diagram of a multi-phase synthetic ripple regulator 100 including a transconductance amplifier with multi-emitter structure 101 implemented according to an exemplary embodiment of the present invention to achieve current balance for four phases. The illustrated embodiment includes four (4) phases or channels, where it is understood that the present invention is not limited by the number of phases and that any number of phases is contemplated. The transconductance amplifier with multi-emitter structure 101 implemented for four phases includes four NPN bipolar-junction transistors (BJT) Q1, Q2, Q3 and Q4, a bias current device CS, four current mirrors M1, M2, M3 and M4 (only M1 shown for purposes of illustration), and four current devices CS1, CS2, CS3 and CS4 (only CS1 shown for purposes of illustration). In the illustrated embodiment, the current mirrors M1–M4 are each 1:1 current mirrors. The emitters of the transistors Q1–Q4 are coupled to one terminal of the bias current device CS, which has its other terminal coupled to ground (GND). The bias current device CS sources or draws a bias current IB from the emitters to GND. The bases of the transistors Q1–Q4 receive a corresponding one of four feedback sense voltages V1, V2, V3 and V4, respectively.

The collector of transistor Q1 is coupled to an input terminal of the current mirror M1, which has an output terminal coupled to a node 103. The node 103 is coupled to an input terminal of the current device CS1, which has an output terminal coupled to GND. The current mirror M1 senses collector current IC1 flowing into the collector of transistor Q1 and outputs the same current level to the node 103. The current device CS1 operates as a current sink that draws a current of IB/4 from node 103 to GND. The resulting difference current IC1–(IB/4) is a correction current ICOR1. Although not shown, current mirror M2 and current device CS2 are coupled together and to the collector of transistor Q2 in the same manner as shown for the current mirror M1 and the current device CS1 coupled to the emitter of transistor Q1 for developing a correction current ICOR2. Although not shown, the current mirror M3, the current device CS3 and the transistor Q3 are coupled in similar manner for developing a correction current ICOR3. Although not shown, the current mirror M4, the current device CS4 and the transistor Q4 are coupled in similar manner for developing a correction current ICOR4.

The correction currents ICOR1–ICOR4 output from the transconductance amplifier with multi-emitter structure 101 are provided to corresponding inputs of a modulator block G, which outputs corresponding duty cycle correction signals D1, D2, D3 and D4, respectively. Thus, D1 is based on ICOR1, D2 is based on ICOR2, D3 is based on ICOR3 and D4 is based on ICOR4. For the first phase or channel 1, the D1 signal is provided to an input of a power stage P1, which has an output coupled to an output circuit O1. The output circuit O1 includes an output inductor L1 with a series DC resistance RDCR1, a resistor R1, and a capacitor C1. The output of the channel 1 power stage P1 is provided to one end of the inductor L1 and to one end of the resistor R1. The resistance RDCR1 is shown in series with the inductor L1 with an intermediate junction K1. The other end of the resistance RDCR1 (or the other end of the inductor L1 from a circuit standpoint) is coupled to an output node 105, which develops an output voltage VOUT. The output node 105 is coupled to one end of the capacitor C1 and to one end of an output capacitor CO. The other end of the capacitor C1 is coupled to the other end of the resistor R1. The junction between capacitor C1 and resistor R1 develops the sense voltage V1, which is fed back and coupled to the base of the transistor Q1. The other end of the output capacitor CO is coupled to GND.

Although not specifically shown, the signals D2, D3 and D4 for channels 2, 3 and 4 are provided to respective inputs of power stages P2, P3 and P4, respectively. The outputs of the power stages P2–P4 are provided to output circuits O2–O4, which develop sense voltages V2–V4, respectively, fed back to the emitters of the transistors Q2–Q4, respectively. The outputs of the output circuits O2–O4 are coupled to the output node 105. The power stages P2–P4 and output circuits O2–O4 are configured and coupled in a similar manner as the power stage P1 and the output circuit O1. Only the specifics of channel 1 are shown and described, where it is understood that the other channels operate in substantially the same manner.

Output current of channel 1 flows from power stage P1 through inductor L1 with its series resistance RDCR1. The resistor R1 and capacitor C1 form an RC circuit coupled in parallel with the inductor L1 for current sensing. The voltage between the junction K1 and the output node VOUT is proportional to the current flowing through the inductor L1 (and through the resistance RDCR1). The DC voltage of the junction K1 is proportional to or otherwise approximately equal to V1, which is sensed by R1 and C1 and fed back as V1. Thus, V1 is a sense voltage proportional to the output current flowing through the output inductor L1 of channel 1. In a similar manner, V2–V4 are sense voltages proportional to the output current flowing through the output inductors L2–L4 of the channels 2–4, respectively. The transconductance amplifier with multi-emitter structure 101 thus senses the output currents of each of the channels 1–4 and outputs the corresponding correction currents ICOR1–ICOR4. It is appreciated by those skilled in the art that there are other methods of generating the feedback voltages V1–V4, such as separate current-sensing resistors, current transformers, means for sensing power switching device resistances, etc.

The feedback loops are used to adjust the output inductor currents on each phase. In particular, the modulator block G uses the correction currents ICOR1–ICOR4 to develop the PWM duty cycle correction signals D1–D4, respectively, to adjust the PWM duty cycles of the four channels 1–4 to achieve current balance between the channels (or phases). Note that as V1 increases, for example, that IC1 increases thereby increasing the current ICOR1 into the modulator block G. The difference between IC1 and IB/4 is the correction current ICOR1 detected by the modulator block G. When ICOR1 increases, the modulator block G responds by reducing the duty cycle of D1 to reduce the output current of O1, thereby reducing V1 to complete the loop control.

FIG. 2 is a more detailed schematic diagram of a transconductance amplifier with multi-emitter structure 200 implemented according to an exemplary embodiment of the present invention to achieve current balance for three phases. In this case, there are only three (3) phases or channels, in which the transconductance amplifier with multi-emitter structure 200 receives three feedback sense voltages V1, V2, and V3 for developing three correction currents ICOR1, ICOR2 and ICOR3, respectively. Although not specifically shown, the correction currents ICOR1–ICOR3 are provided to corresponding inputs of a modulator block similar to the modulator block G, which outputs corresponding duty cycle correction signals D1, D2, and D3 provided to three power stages, similar to the power stages P1, P2 and P3. The modulator block for the transconductance amplifier with multi-emitter structure 200, however, performs an inversion between ICOR1–ICOR3 and D1–D3, respectively (e.g., as a correction current ICORx decreases (or increase), the duty cycle of the corresponding D1x signal is decreased (or increased) to reduce (or increase) the corresponding feedback voltage signal Vx).

The three power stages provide a corresponding three outputs, which are provided to respective inputs of three output circuits, similar to the output circuits O1, O2 and Q3. The output circuits each include an output inductor with a series DC resistance RDC, and a means for developing the feedback voltages V1–V3 indicative of the respective output inductor currents in a similar manner as previously described. Thus, the output current sense voltages V1–V3 are used to sense the output inductor currents of the output stages and to develop the three corresponding correction currents ICOR1–ICOR3. Many methods are available for generating the V1–V3 voltages, such as the synthetic method illustrated by the regulator 100, and other methods known to those skilled in the art as previously described.

The voltages V1, V2 and V3 are provided to the respective bases of three PNP BJTs Q1, Q2 and Q3. The emitter of transistor Q1 is coupled to one end of a resistor R1, the emitter of transistor Q2 is coupled to one end of a resistor R2, and the emitter of transistor Q3 is coupled to one end of a resistor R3. The other ends of the resistors R1–R3 are coupled together at a node 201. The collector of transistor Q1 is coupled to one end of a resistor-capacitor (RC) circuit RC1 at a node 202, where RC1 includes a resistor and capacitor coupled in parallel. In a similar manner, the collector of transistor Q2 is coupled to one end of another RC circuit RC2 at a node 203, and the collector of transistor Q3 is coupled to one end of a resistor-capacitor circuit RC3 at a node 203, where RC2 and RC3 are configured in substantially the same manner as RC1. The other ends of the RC1, RC2 and RC3 circuits are coupled together to ground (GND). A first current source I1 has an input coupled to a node 205 receives a voltage source signal VDD, and an output coupled to node 201, where the current source I1 sources current from VDD into node 201.

The nodes 202, 203 and 204 are coupled to the bases of three PNP BJTs Q5, Q7 and Q9, respectively, having collectors coupled to GND. The emitters of transistors Q5, Q7 and Q9 are coupled to the collectors and bases of another three PNP BJTs Q4, Q6 and Q8, respectively, having emitters coupled to nodes 206, 207 and 208, respectively. Three current sources I2, I3 and I4 have inputs coupled to node 205 for sourcing current from VDD into nodes 206, 207 and 208, respectively. The nodes 206, 207 and 208 are coupled to the bases of NPN BJTs Q11, Q12 and Q13, respectively, having emitters coupled together at a node 209. The collector of transistor Q11 is coupled to a node 210, which is coupled to the input of a current mirror M1. In a similar manner, the collector of transistor Q12 is coupled to a node 212, which is coupled to the input of a current mirror M2, and the collector of transistor Q13 is coupled to a node 214, which is coupled to the input of a current mirror M3.

The current mirrors M1–M3 are coupled to the node 205 and are each configured in a similar manner. Each current mirror M1–M3 includes a first pair of PNP BJTs having common-coupled bases, a diode-coupled transistor and emitters coupled to VDD via node 205. Each current mirror further includes a second pair of PNP BJTs having common bases, a diode-coupled transistor and emitters coupled to the collectors of the first pair of PNP BJTs. The first or upper pair of transistors perform the actual current mirror function and the second or lower pair are coupled in cascode with the first pair to form a current buffer for the respective current mirror.

The current mirrors M1, M2 and M3 sense collector currents of the transistors Q11, Q12 and Q13, respectively, at input nodes 210, 212 and 214, respectively, and generate mirrored currents to current correction nodes 211, 213, and 215, respectively, which develop the output correction currents ICOR1, ICOR2 and ICOR3, respectively. The nodes 211, 213 and 215 are coupled to the respective drains of three N-channel field-effect transistors (FETs) F1, F2 and F3. The sources of the FETs F1–F3 are coupled to GND and the gates of FETs F1–F3 are coupled together at a node 216. The node 209 is coupled to the drain of another N-channel FET F4, having its gate coupled to node 216 and its source coupled to GND. The node 216 is coupled to the gate and drain of another N-channel FET F5, having its source coupled to GND. Another current source I5 has an input coupled to VDD via node 205 and an output coupled to source current into node 216. The FETs F1–F5 are configured as N-channel metal-oxide semiconductor FETs (or NMOS transistors) in the configuration illustrated.

In operation, the initial or first stage formed by resistors R1–R3, transistors Q1–Q3 and RC circuits RC1–RC3 performs voltage gain, inversion and filtering functions of the V1–V3 signals for generating the voltages of the nodes 202, 203 and 204, respectively. The total current through the three branches remains constant and the relative current through each branch is controlled by the voltage levels of the feedback sense signals V1–V3. As the voltage any of the V1–V3 signals increases (or decreases), the corresponding voltage of the nodes 202–204 decreases (or increases). The second stage formed by current sources I2–I4 and Q4–Q9 operates to voltage shift and buffer the voltages of the nodes 202–204, so that the voltages of the nodes 206–208 follow the voltages of the nodes 202–204, respectively. In this manner, the voltages of the nodes 206, 207 and 208 are inverted, buffered, amplified and level-shifted versions of the feedback voltages V1, V2 and V3, respectively.

The current source I5 generates a current IB through FET F5, which is coupled in a 1:1 current-mirror configuration with FET F4 so that a current of IB flows through node 209 into FET F4. In this manner, the total current through transistors Q11, Q12 and Q13 into node 209 is IB and the total current output from the current mirrors M1–M3 into nodes 211, 213 and 215 is IB. The FETs F1, F2 and F3 are coupled in a 1:3 current-mirror configuration with FET F4, so that the FETs F1, F2 and F3 each draw a current of IB/3 from the nodes 211, 213 and 215, respectively. The relative voltage levels of the nodes 206, 207 and 208 modify the relative currents through the transistors Q11, Q12 and Q13, respectively, which currents are mirrored into the nodes 211, 213 and 215, respectively by the current mirrors M1–M3. The differences between the current IB/3 and the currents output from the current mirrors M1–M3 is reflected in the correction currents ICOR1–ICOR3. In the overall transfer function, an increase (or decrease) in voltage of a feedback sense voltage Vx, caused by an increase (or decrease) in current through a corresponding output inductor, is reflected by a proportional decrease (or increase) of the corresponding correction current ICORx. The modulator block for the transconductance amplifier with multi-emitter structure 200 responds by decreasing (or increasing) the duty cycle of the corresponding signal Dx to decrease (or increase) the current through the corresponding output inductor of the corresponding channel.

A transconductance amplifier with multi-emitter structure, such as exemplified by the amplifiers 101 and 200, operates to balance the output inductor currents of the N output stages of an N-phase regulator, where "N" is a positive integer greater than 1. The transconductance amplifier with multi-emitter structure 101 illustrates the case for balancing the four channels (i.e., N=4) of the synthetic ripple regulator 100, and the transconductance amplifier with multi-emitter structure 200 illustrates a three-phase case (i.e., N=3) for a similar type three-phase regulator. Although the present invention is illustrated for use with a synthetic ripple regulator, it is understood that other regulator or converter types are contemplated.

Although the present invention has been described in considerable detail with reference to certain preferred versions thereof, other versions and variations are possible and contemplated. For example, the illustrated transistor types including bipolar transistors and the like, MOSFETs, FETs, etc., may be replaced by other types of transistor devices for performing similar functions. The term "emitter" as used herein referencing bipolar transistor types is intended to encompass similar types of terminals, such as the drain or source of FETs or MOSFETs and the like. The base/gate terminals are current control terminals and the collector/drain and emitter/source terminals form first and second current terminals. Those skilled in the art should appreciate that they can readily use the disclosed conception and specific embodiments as a basis for designing or modifying other structures for providing out the same purposes of the present invention without departing from the spirit and scope of the invention as defined by the following claims.

The invention claimed is:

1. A transconductance amplifier with multi-emitter structure for balancing current of a multi-phase regulator, comprising:
a plurality of transistors, each having first and second current terminals and a current control terminal receiving a corresponding one of a plurality of sense voltages, each sense voltage indicative of output inductor current of a corresponding phase of the multi-phase regulator;
a bias current device coupled to the first current terminals of each of said plurality of transistors;
a plurality of current mirrors, each having an input coupled to a second current terminal of a corresponding one of said plurality of transistors and an output coupled to a corresponding one of a plurality of correction nodes; and
a plurality of current sources, each coupled to a corresponding one of said plurality of correction nodes.

2. The transconductance amplifier of claim 1, wherein said plurality of transistors comprise N transistors, wherein said bias current device develops a current IB, and wherein each of said plurality of current sources develops a current IB/N, wherein N is a positive integer greater than 1.

3. The transconductance amplifier of claim 2, wherein said bias current device comprises:
a current source sourcing a current IB;
a diode-coupled first device coupled to said current source; and
a second device having an input coupled to said diode-coupled device in a 1:1 current mirror configuration and an output coupled to said first current terminal of each of said plurality of transistors.

4. The transconductance amplifier of claim 3, wherein each of said plurality of current mirrors comprises a third device having an input coupled to said first device in a 1:N current mirror configuration and an output coupled to a corresponding one of said plurality of correction nodes.

5. The transconductance amplifier of claim 4, wherein said first, second and third devices each comprise NMOS transistors.

6. The transconductance amplifier of claim 1, wherein each of said plurality of transistors comprises a bipolar transistor.

7. The transconductance amplifier of claim 6, wherein said first and second terminals of said plurality of transistors comprise emitters and collectors, respectively.

8. The transconductance amplifier of claim 1, wherein each of said plurality of sense voltages is based on a corresponding voltage of a DCR of a corresponding one of a plurality of output inductors.

9. The transconductance amplifier of claim 1, further comprising a plurality of input amplifier filter stages, each receiving a corresponding one of said plurality of sense voltages and providing a corresponding one of a plurality of buffered voltages provided to said plurality of transistors.

10. An N-phase regulator, comprising:
N output circuits for each of N phases;
N output current sensing circuits, each sensing output current of a corresponding one of said N output circuits and providing a corresponding one of N sense voltages;
a transconductance amplifier with multi-emitter structure, comprising:
N transistors, each having first and second current terminals and a control terminal receiving a corresponding one of said N sense voltages;
a bias current device coupled to said first current terminals of each of said N transistors;
N current mirrors, each having an input coupled to a second terminal of a corresponding one of said N transistors and an output coupled to a corresponding one of N correction nodes; and
N current sources, each coupled to a corresponding one of said N correction nodes; and
a power circuit having N inputs each coupled to a corresponding one of said N correction nodes and N outputs each providing a PWM signal with corrected duty cycle to a corresponding one of said N output circuits, wherein N is a positive integer greater than 1.

11. The regulator of claim 10, wherein said bias current device develops a current IB, and wherein each of said N current sources sinks a current IB/N.

12. The regulator of claim 10, wherein each of said N sense voltages is based on a corresponding voltage of a DCR of a corresponding one of N output inductors of said N output circuits.

13. The regulator of claim 10, wherein said power circuit comprises an N-channel modulator block that adjusts duty cycle of each of N PWM signals based on a corresponding one of said N correction currents.

14. A method of balancing current in an N-phase regulator, comprising:
sensing output current for each of the N phases and providing corresponding N feedback sense voltages;
biasing N transistors with a total bias current of IB;
applying each of the N feedback sense voltages to a control input of a corresponding one of the N transistors to develop N sense currents;
mirroring each of the N sense currents into a corresponding one of N correction nodes;
sourcing a current of IB/N relative to each of the N correction nodes to provide N correction currents; and
adjusting current of each of the N phases based on a corresponding one of the N correction currents, wherein N is a positive integer greater than 1.

15. The method of claim 14, wherein said sensing output current comprises sensing voltage across the DCR of an output inductor.

16. The method of claim 14, wherein said biasing N transistors comprises sourcing a current IB relative to common-coupled emitters of the N transistors.

17. The method of claim 14, wherein said sourcing a current of IB/N relative to each of the N correction nodes comprises drawing a current of IB/N from each of the N correction nodes.

18. The method of claim 14, wherein said adjusting current of each of the N phases comprises adjusting duty cycle of each of N PWM control signals.

* * * * *

UNITED STATES PATENT AND TRADEMARK OFFICE
CERTIFICATE OF CORRECTION

| | | |
|---|---|---|
| PATENT NO. | : 7,015,757 B2 | |
| APPLICATION NO. | : 10/803006 | |
| DATED | : March 24, 2006 | |
| INVENTOR(S) | : Xuening Li and Thomas A. Jochum | |

It is certified that error appears in the above-identified patent and that said Letters Patent is hereby corrected as shown below:

Item [75] on the title page Inventor Xuening Li is the First Inventor. Please insert Inventor --Xuening Li--

Signed and Sealed this

Twenty-fifth Day of December, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,015,757 B2 | Page 1 of 1 |
| APPLICATION NO. | : 10/803006 | |
| DATED | : March 21, 2006 | |
| INVENTOR(S) | : Xuening Li and Thomas A. Jochum | |

It is certified that error appears in the above-identified patent and that said Letters Patent is hereby corrected as shown below:

Item [75] on the title page Inventor Xuening Li is the First Inventor. Please insert Inventor --Xuening Li--

This certificate supersedes the Certificate of Correction issued December 25, 2007.

Signed and Sealed this

Twenty-ninth Day of January, 2008

JON W. DUDAS
*Director of the United States Patent and Trademark Office*